US006184810B1

(12) United States Patent
Burns

(10) Patent No.: US 6,184,810 B1

(45) Date of Patent: Feb. 6, 2001

(54) METHOD AND APPARATUS TO GENERATE MIXED SIGNAL TEST STIMULUS

(75) Inventor: Mark A. Burns, McKinney, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/143,463

(22) Filed: Aug. 28, 1998

Related U.S. Application Data

(60) Provisional application No. 60/057,271, filed on Aug. 29, 1997.

(51) Int. Cl.[7] ........................ H03M 1/00

(52) U.S. Cl. ........................ 341/143; 341/118; 341/141

(58) Field of Search ........................ 341/118, 120, 341/155, 144, 110, 141

(56) References Cited

U.S. PATENT DOCUMENTS

| | | | | |
|---|---|---|---|---|
| 4,118,787 | * | 10/1978 | Arnoux | 364/842 |
| 5,559,440 | * | 9/1996 | Lopresti et al. | 324/607 |
| 5,731,772 | * | 3/1998 | Mikkola et al. | 341/118 |
| 5,781,137 | * | 7/1998 | Knudsen | 341/118 |
| 5,909,186 | * | 6/1999 | Gohringer | 341/120 |
| 5,969,653 | * | 10/1999 | Sachdev | 341/120 |
| 5,974,363 | * | 10/1999 | Gammel et al. | 702/117 |

* cited by examiner

*Primary Examiner*—Peguy JeanPierre

(74) *Attorney, Agent, or Firm*—Alan K. Stewart; Wade James Brady, III; Frederick J. Telecky, Jr.

(57) ABSTRACT

A signal generation circuit comprises a memory operable to store a digital signal comprising a stream of one-bit samples that were generated using sigma delta modulation. The signal generation circuit further comprises a signal modification circuit coupled to the memory and operable to receive the digital signal from the memory and to introduce a DC level shift to the digital signal, wherein the output of the signal modification circuit can be filtered to produce an analog signal.

16 Claims, 2 Drawing Sheets

METHOD AND APPARATUS TO GENERATE MIXED SIGNAL TEST STIMULUS

This application claims priority under 35 USC § 119(e) (1) of provisional application Ser. No. 60/057,271 filed Aug. 29, 1997.

TECHNICAL FIELD OF THE INVENTION

This invention relates generally to the field of electronic devices and more particularly to method and apparatus for generating analog and digital signals.

BACKGROUND OF THE INVENTION

Mixed signal generation circuits capable of generating both digital and analog signals are useful in a variety of applications, including generating test signals for transmission to various circuit elements. Traditional mixed signal circuit testers generate digital and analog signals using two distinct types of signal sources. Digital signals are typically produced by a digital subsystem and associated digital pin card electronics. Such a system typically comprises a digital vector memory coupled to a one-bit digital-to-analog converter, which essentially serves as an amplifier. Analog signals are generally produced by separate analog instruments, such as arbitrary waveform generators.

A typical arbitrary waveform generator may comprise a bank of memory storing a set of waveform samples. These samples are passed to a multi-bit digital-to-analog converter, which generates an analog signal from the samples received. A problem with this method when employed for on-chip self testing is that implementing the multi-bit digital-to-analog converter requires substantial substrate area. In large testers or on a chip, cost constraints generally prohibit implementing large numbers of these analog instruments, ultimately limiting the volume of mixed test signals produced. The limited analog resources often lead to longer test times, since the inputs must be stimulated one at a time.

Another approach to generating mixed signals is to generate a bitstream with a ring oscillator, and to apply the bitstream to a sigma delta modulator to create a noise-shaped sample. The noise shaped sample is then applied to a one-bit digital-to-analog converter. The output of the digital-to-analog converter is then filtered to form a smooth analog waveform. A problem with this approach is that the resulting analog signal is limited to 20 decibels below full scale. Devices under test typically require full analog stimuli, limiting the value of this approach. Another problem with this method is that the sigma delta modulator hardware is expensive to implement.

SUMMARY OF THE INVENTION

In accordance with the teachings of the present invention, a signal generation circuit is provided that eliminates or substantially reduces problems associated with prior approaches. According to one embodiment of the present invention, a signal generation circuit comprises a memory operable to store a digital signal comprising a stream of one-bit samples that were generated using sigma delta modulation. The signal generation circuit further comprises a signal modification circuit coupled to the memory and operable to receive the digital signal from the memory and to introduce a DC level shift to the digital signal, wherein the output of the signal modification circuit can be filtered to produce an analog signal.

The present invention has several important technical advantages. Because the characteristics of the required analog waveforms are known a-priori, expensive sigma delta modulation hardware may be replaced with a software equivalent. On-chip test circuitry may be simplified by eliminating a multi-bit digital to analog converter. The invention also makes efficient use of existing circuit tester hardware. For example, the existing memory required for digital vector storage can be reused for analog waveform storage. Additionally, circuit elements required to produce DC level shift voltages may be used to program both analog and digital signals.

The invention facilitates production of full scale analog and digital signals from a single channel card. A channel card may refer to a tester resource which supplies stimulus to a device under test and/or measures responses from a device under test. Consequently, a signal tester can test a device with many digital pins and few analog pins, or a device with many analog pins and few digital pins. Additionally, production of full scale analog signals eliminates problems associated with prior approaches that produced analog signals limited to 20 decibels below full scale.

Flexibility in the invention's design facilitates placement of a low pass filter for filtering analog signals on a device-specific test board, on a channel card (thus creating a true per-pin mixed signal test source), or on the device itself. The invention helps to facilitate cross compilation of mixed signal test programs implemented from designer-generated test stimuli. Presently, digital signals can be cross compiled from designer-generated test vectors using commercially available computer aided drafting tools. Although there is currently no mixed signal equivalent to this process, the present invention may be effective in providing a solution in the future.

BRIEF DESCRIPTION OF THE DRAWINGS

A more complete understanding of the teachings of the present invention may be acquired by referring to the accompanying figures in which like reference numbers indicate like features and wherein.

DETAILED DESCRIPTION OF THE INVENTION

Figure 1:
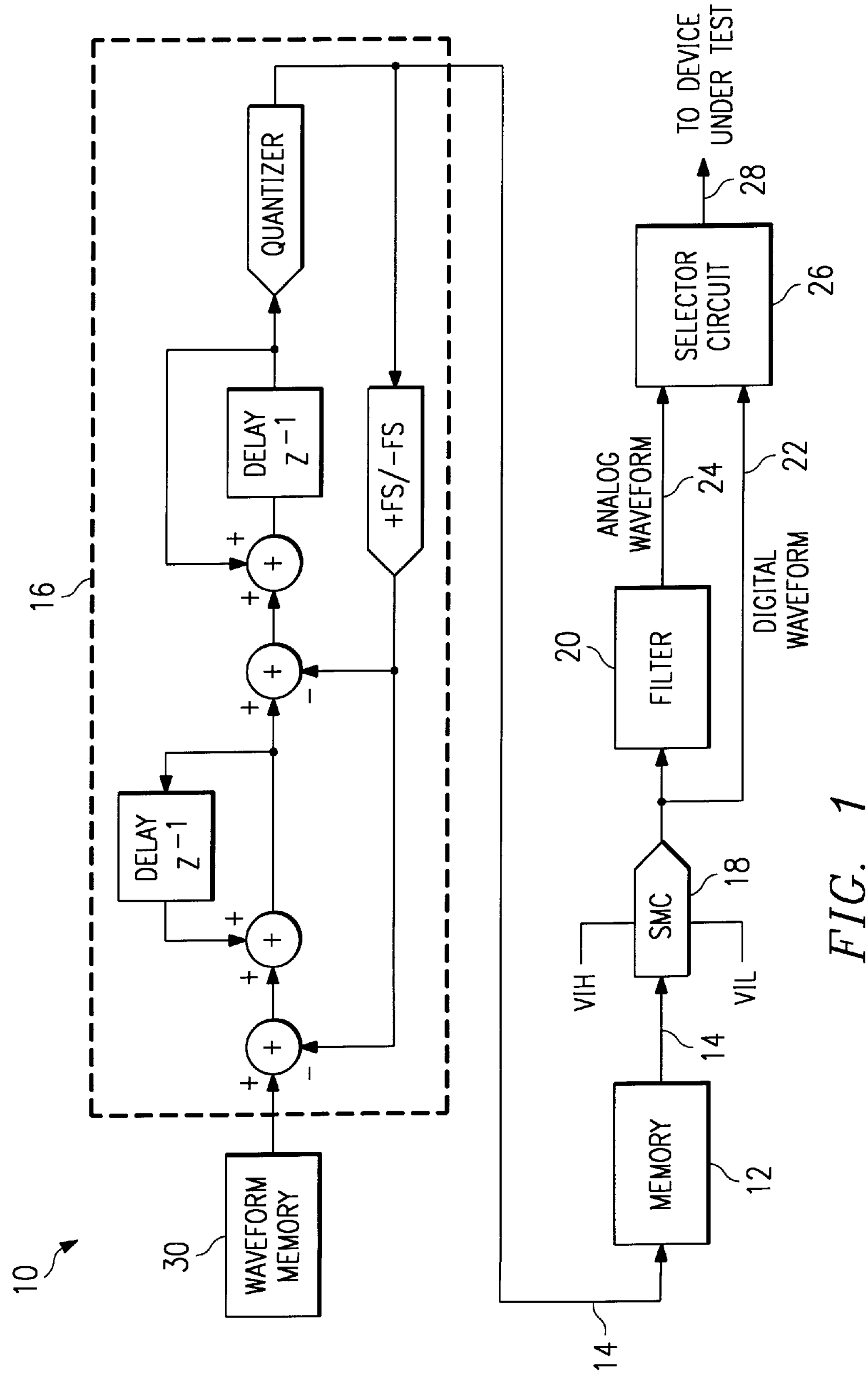
FIG. 1 is a block diagram of a signal generation circuit according to the teachings of the present invention.

FIG. 1 is a block diagram of a signal generation circuit constructed according to the teachings of the present invention. A signal generation circuit 10 may include a memory 12 operable to receive and store a digital representation of an analog signal 14. Memory 12 may comprise any device operable to receive and store an incoming signal and allow access to the signal for later retrieval. Memory 12 may comprise, for example, a series of scan chain registers, a dynamic ROM, a static ROM, an EPROM, etc. Digital signal 14 may be a precomputed, noise-shaped digital representation of an analog signal generated by a sigma delta modulator 16 or a pure digital signal such as a digital test pattern. Sigma delta modulator 16 may comprise a hardware embodiment, a software embodiment, or any combination of hardware and software forming a sigma delta modulator. Sigma delta modulator 16 may be, for example, a second order sigma delta modulator as illustrated in FIG. 1. Sigma delta modulator 16 may, however, comprise any order sigma delta modulator as appropriate to a particular application. The design and operation of sigma delta modulators are known and any existing design could be chosen depending upon the application.

A signal modification circuit (SMC) 18 may be coupled to memory 12. Throughout this document, the term "coupled" is used to signify a communication between two or more elements, and does not necessarily denote physical connection of the elements, or direct communication between the elements. Signal modification circuit 18 may comprise any circuit element operable to receive a digital signal from memory 12 and to introduce a DC level shift to the signal received. Signal modification circuit 18 may comprise, for example, a one bit digital-to-analog converter. A filter 20 may be coupled to signal modification circuit 18. Filter 20 may comprise any circuitry operable to receive a signal from signal modification circuit 18 and to convert that signal to an analog waveform 24. Filter 20 may comprise, for example, a low pass filter. Any type of filter may be implemented to perform the conversion function of filter 20, such as an Nth order Butterworth filter. A selector circuit 26 may receive digital waveform 22 from signal modification circuit 18 and analog waveform 24 from filter 20. Selector circuit 26 may select between analog waveform 24 and digital waveform 22, and pass the selected signal 28 as an output signal 28. Output signal 28 may, for example, comprise a test signal passed to a circuit element under test.

In operation, sigma delta modulator 16 may receive a waveform sample from a waveform memory 30. Waveform memory 30 may comprise any memory structure or device operable to store one or more waveform samples and facilitate retrieval of the same. Ordinarily, waveform memory 30 stores a stream of multi-bit digital samples of an analog waveform. Sigma delta modulator noise shapes the incoming signal to form precomputed noise shaped digital representation of an signal 14, which comprises a stream of one-bit samples. Memory 12 receives and stores precomputed digital signal 14. Signal modification circuit 18 may receive precomputed digital signal 14 from memory 12. Signal modification circuit 18 may operate to program digital signal 14 by introducing a DC level shift to the signal and/or quieting noise in the signal. In one embodiment, signal modification circuit 18 may comprise a one bit digital-to-analog converter. In that case, signal modification circuit 18 may receive a high DC power supply voltage VIH and a low DC power supply voltage VIL. DC voltages VIH and VIL may be used to introduce a DC level shift into digital signal 14 to program the signal ultimately passed to a device under test. Filter 20 receives programmed digital waveform 22 from signal modification circuit 18 and constructs a smooth analog waveform 24. Selector circuit 26 receives both digital waveform 22 and analog waveform 24, and selects one signal for transmission as output signal 28.

The present invention provides an advantage of facilitating a single circuit capable of producing both analog and digital signals. Precomputed digital signal 14, for example, may be retrieved from memory 12 and utilized as a digital test stimulus to a device under test. Additionally, precomputed digital signal 14 may first be passed to signal modification circuit 18 for programming and/or noise reduction and then passed to a device under test as a digital stimulus having predetermined characteristics. Alternatively, precomputed digital signal 14 may be passed to filter 20, which generates a smooth analog waveform 24 based on the digital representation received.

The present invention facilitates flexible component design. One or more portions of signal generation circuit 10 may comprise, for example, a circuit tester, one or more channel cards within a circuit tester, or an on-chip testing circuit formed integrally on-chip with the device to be tested. Memory 20 may exist externally to a device comprising signal generation circuit 10, or may reside within such a device. Memory 20 may comprise, for example, a common memory structure of a circuit tester, or a memory structure unique to a particular channel card within a tester. Similarly, sigma delta modulator 16 may reside within a device comprising signal generation circuit 10 or externally to such a device. Signal modification circuit 18 may reside, for example, on a particular channel card within a circuit tester, or on-chip as part of a self-test circuit in an integrated circuit. Likewise, selector circuit 18 may reside within a circuit tester comprising signal modification circuit 10, or as an integral part of an on-chip test circuit. Filter 20 may exist within a circuit tester, as part of a particular channel card of a circuit tester, integral to a chip as part of an on-chip testing circuit, on a device interface board (DIB) supporting a device to be tested or on the device under test itself.

Figure 2:
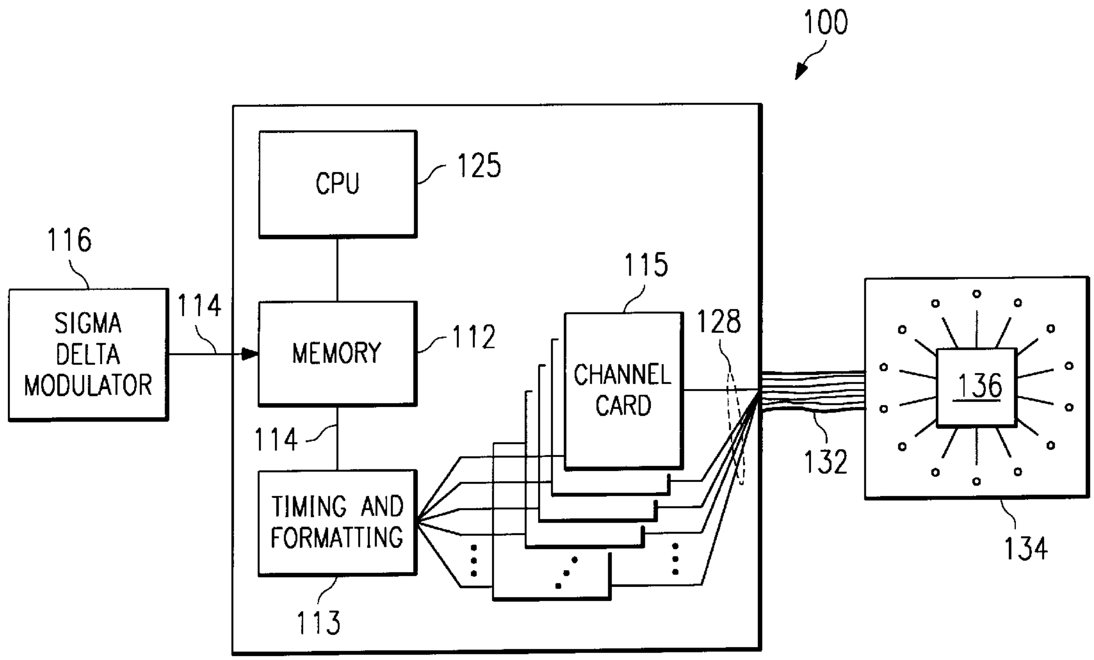
FIG. 2 is a block diagram of a circuit tester constructed according to the teachings of the present invention.

FIG. 2 is a block diagram of a circuit tester 100 constructed according to the teachings of the present invention. Circuit tester 100 may include a memory 112 operable to receive and store a digital signal 114. Memory 112 is similar in structure and function to memory 12 shown in FIG. 1. Digital signal 114 may be a precomputed noise shaped digital representation of an analog signal generated by a sigma delta modulator, or a pure digital signal. Digital signal 114 is similar to digital signal 14 described with reference to FIG. 1. Sigma delta modulator 116 may comprise a hardware embodiment, a software embodiment or any combination of hardware and software embodiments. Sigma delta modulator 116 is similar in structure and function to sigma delta modulator 16 of FIG. 1. Sigma delta modulator 116 may exist externally to circuit tester 100. Alternatively, sigma delta modulator 116 may reside within circuit tester 100. A software embodiment of sigma delta modulator 116, may exist, for example, within the memory of a central processing unit (CPU) 125. Sigma delta modulator 116 may also exist in a hardware embodiment within tester 100 (not explicitly shown). Central processing unit 125 may operate to perform various control functions within circuit tester 100. A timing and formatting circuit 113 may be coupled to memory 112. Timing and formatting circuit 113 may operate to receive digital signal 114 from memory 112 and format digital signal 114 for processing in a channel card 115.

Channel cards 115 may be coupled to timing and formatting circuit 113. Channel card 115 may comprise signal generation circuitry for receiving and processing digital signal 114. Central processing unit 125 may control channel cards 115 through a control bus (not explicitly shown). Channel cards 115 may transmit an output signal 128 over a cable 132 to a DIB board 134. Test device 136 may be coupled to DIB board 134 to receive output signal 128 from channel card 115. Output signal 128 is used as a test stimulus for test device 136.

Figure 3:
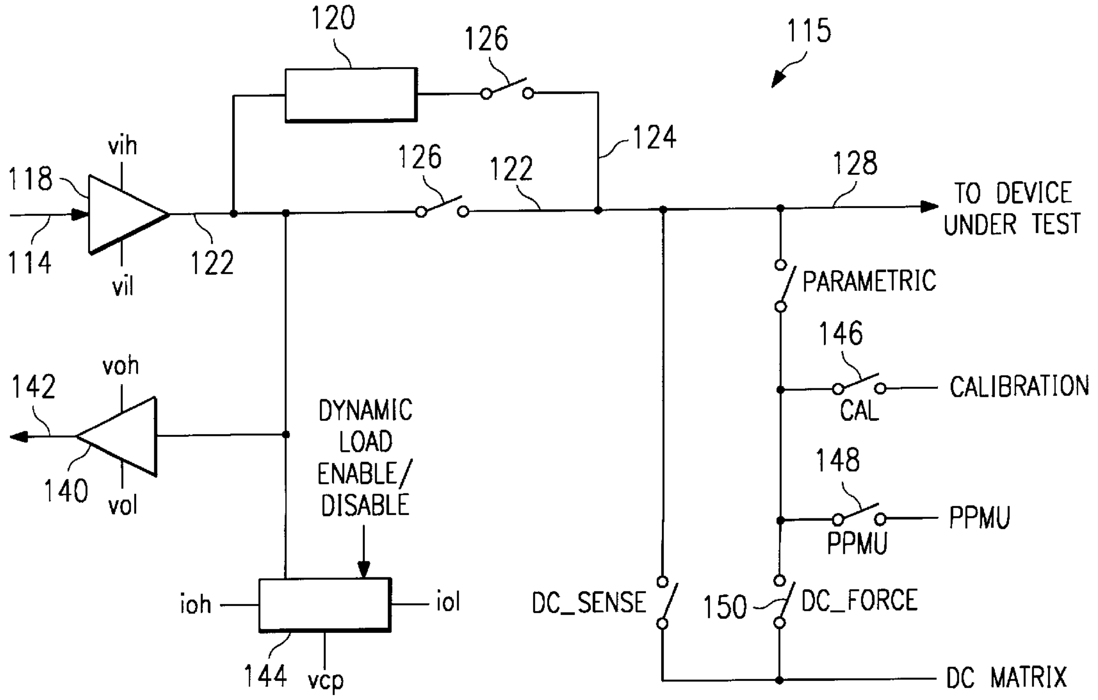
FIG. 3 is a schematic diagram of a channel card, including a signal generation circuit constructed according to the teachings of the present invention.

FIG. 3 is a schematic diagram of an exemplary channel card 115, including a signal generation circuit constructed according to the teachings of the present invention. Channel card 115 may include a signal modification circuit 118 operable to receive a digital signal 114 which comprises either a pure digital signal or a precomputed noise-shaped digital representation of an analog signal. In this embodiment, analog signals are represented as streams of one-bit samples. Signal modification circuit 118 is similar in structure and function to signal modification circuit 18 of FIG. 1. Signal modification circuit 118 may receive power supply DC signals VIH and VIL, and may utilize their voltage difference to adjust digital signal 114 with a DC level shift voltage. Signal modification circuit 118 may also operate to quiet noise in signal 114. Signal modification circuit 118 produces a digital waveform 122. Digital waveform 122 may be transmitted as output signal 128, for example, to a test device.

A filter 120 may receive digital waveform 122 and convert digital waveform 122 to an analog waveform 124. Analog waveform 124 may be passed, for example, to a device under test as output signal 128. A selector circuit 126 may receive digital waveform 122 from signal modification circuit 118 and analog waveform 124 from filter 120. Selector circuit 126 may select between analog waveform 124 and digital waveform 122, and pass the selected signal 128 as an output. Selector circuit 126 may comprise any circuitry operable to receive analog signal 124 and digital signal 122, and to select one of the incoming signals for transmission as output signal 128. In one embodiment, filter 120 and selector circuit 126 may exist as part of channel card 115. Filter 120 and/or selector circuit 126 may, however, exist separately from channel card 115. These elements may reside, for example, on DIB board 134 (not explicitly shown) or on the device under test itself.

Channel card 115 may further include a comparator 140 operable to receive digital waveform 122 and convert digital waveform 122 to a bit stream 142. Channel card 115 may also include a dynamic load enabling circuit 144. Dynamic load enabling circuit 144 may comprise a diode-rich circuit operable to ensure that channel card 115 operates within specified current and voltage ranges. Channel card 115 may include calibration circuitry 146 operable to calibrate high and low programming voltages. A per pin measurement unit (PPMU) 148 may operate as a simple DC source when signal modification circuit 118 is not operating. In a similar manner, DC force circuitry 150 may operate as a high precision DC voltage source.

In operation, circuit tester 100 receives preprogrammed noise-shaped digital representation of an analog signal 114 from sigma delta modulator 116. Memory 112 receives and stores signal 114. Timing and formatting circuit 113 receives signal 114 and formats it for processing at channel card 115. Signal modification circuit 118 of channel card 115 receives signal 114 from timing and formatting circuitry 113. Signal modification circuit 118 adjusts signal 114 to form digital waveform 122. In addition, signal modification circuit 118 may quiet noise in signal 114. Filter 120 receives digital waveform 122 from signal modification circuit 118 and converts digital waveform 122 to analog waveform 124. Selecting circuit 126 receives both digital waveform 122 and analog waveform 124 and determines which signal, if any, should be transmitted to a device under test as output signal 128. Tester 100 provides an advantage of facilitating the production of analog and digital test stimuli from a single channel card, making efficient use of existing tester hardware.

Although the present invention has been described in detail, it should be understood that various changes, substitutions, and alterations can be made hereto without departing from the spirit and scope of the invention as defined by the appended claims.

What is claimed is:

1. A signal generation circuit comprising:

a memory operable to store a digital signal comprising a stream of one-bit samples that were generated using sigma delta modulation;

a signal modification circuit coupled to the memory and operable to receive the digital signal from the memory and to introduce a DC level shift to the digital signal, wherein the output of the signal modification circuit can be filtered to produce an analog signal;

a filter coupled to the signal modification circuit and operable to receive the digital signal from the signal modification circuit and to filter the digital signal to generate an analog signal; and a selector circuit coupled to the signal modification circuit and the filter, the selector circuit operable to select either the output of the filter or the output of the signal modification circuit as an output signal.

2. The signal generation circuit of claim 1, wherein the signal modification circuit is further operable to perform one-bit digital-to-analog conversion.

3. The signal generation circuit of claim 1, further comprising a sigma delta modulator coupled to the memory and operable to generate the digital signal and transmit the digital signal to the memory.

4. The signal generation circuit of claim 1, further comprising a software simulation of a sigma delta modulator operable to generate the digital signal and transmit the digital signal to the memory.

5. The signal generation circuit of claim 1, wherein the signal generation circuit comprises at least one channel card of a circuit tester.

6. The signal generation circuit of claim 1, wherein the memory and signal modification circuit reside on an integrated circuit and wherein the digital signal is used for testing the integrated circuit.

7. A circuit tester comprising:

a memory operable to store a digital signal comprising a stream of one-bit samples that were generated using sigma delta modulation;

a timing and formatting circuit for receiving the digital signal from the memory and controlling the timing of the digital signal for processing;

a signal modification circuit coupled to the timing and formatting circuitry and operable to receive the digital signal from the timing and formatting circuitry and to introduce a DC level shift to the digital signal, wherein the output of the signal modification circuit can be filtered to produce an analog signal;

a filter coupled to the signal modification circuit and operable to receive the digital signal from the signal modification circuit and to filter the digital signal to generate an analog signal; and a selector circuit coupled to the signal modification circuit and the filter, the selector circuit operable to receive the digital signal from the signal modification circuit and the analog signal from the filter and to select one signal as an output signal.

8. The circuit tester of claim 7, further comprising a sigma delta modulator coupled to the memory and operable to generate the digital signal and transmit the digital signal to the memory.

9. The circuit tester of claim 7, further comprising a software simulation of a sigma delta modulator operable to generate the digital signal and transmit the digital signal to the memory.

10. A method of generating signals comprising:

storing a digital signal in a memory, the digital signal comprising a precomputed noise-shaped digital representation of an analog signal, the digital signal further comprising a series of one bit samples that were generated using sigma delta modulation;

outputting the digital signal from the memory;

filtering the digital signal using a filter to generate an analog signal;

selecting between an output of the memory, directly or indirectly, and the output of the filter; and transmitting the selected signal as an output signal.

11. The method of claim 10, further comprising introducing a DC level shift into the digital signal by performing a one-bit digital-to-analog conversion.

12. The method of claim 10, further comprising:

selecting between an output of the memory, directly or indirectly, and the output of the filter; and transmitting the selected signal as an output signal.

13. The method of claim 10, further comprising:

performing sigma delta modulation using a sigma delta modulator on a reference signal to generate the digital signal.

14. The method of claim 10, further comprising the step of simulating sigma delta modulation using computer software on a reference signal to generate digital signal.

15. The method of claim 10, wherein the filter comprises a low pass filter.

16. The method of claim 10, wherein the filter comprises an Nth order Butterworth filter.

* * * * *